US012432868B2

(12) United States Patent
Ritter

(10) Patent No.: US 12,432,868 B2
(45) Date of Patent: *Sep. 30, 2025

(54) HOUSING WITH INTERNAL LOCKING ARRANGEMENT

(71) Applicant: KONINKLIJKE PHILIPS N.V., Eindhoven (NL)

(72) Inventor: Jasmin Ritter, Stuttgart (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 121 days.

This patent is subject to a terminal disclaimer.

(21) Appl. No.: 18/133,122

(22) Filed: Apr. 11, 2023

(65) Prior Publication Data

US 2023/0247775 A1 Aug. 3, 2023

Related U.S. Application Data

(63) Continuation of application No. 17/291,537, filed as application No. PCT/EP2019/079319 on Oct. 28, 2019, now Pat. No. 11,627,669.

(30) Foreign Application Priority Data

Nov. 5, 2018 (EP) .................................... 18204297

(51) Int. Cl.
*H05K 5/15* (2025.01)
(52) U.S. Cl.
CPC ..................................... *H05K 5/15* (2025.01)
(58) Field of Classification Search
CPC ... H05K 5/0217; H05K 5/0013; H05K 5/0221
See application file for complete search history.

(56) References Cited

U.S. PATENT DOCUMENTS 5,791,632 A 8/1998 Brenes
6,157,532 A * 12/2000 Cook ...................... G06F 1/181
312/265.2

(Continued)

FOREIGN PATENT DOCUMENTS

CN 104184849 A 12/2014
JP 1165682 A 6/1989

(Continued)

OTHER PUBLICATIONS

International Search Report and Written Opinion, International Application No. PCT/EP2019/079319, Mailed on Jan. 27, 2020.

*Primary Examiner* — Sagar Shrestha

(57) ABSTRACT

The present invention relates to a housing (10) with one first housing part (12) and one second housing part (14), which are reliably locked by an internal locking arrangement. The locking arrangement is suitable for various types and sizes of housings, particularly for the housings of electronic and display devices. The locking mechanism comprises a first locking element (30) being arranged moveably along an axis on the first housing part (12) and comprises a first engaging portion (32) that forms an engaged or disengaged state with a second engaging portion (42), which is arranged on the first housing part (12). A third engaging portion (52) arranged on the second housing part (14) is locked-in in the engaged state leading to a reliable locking of the first housing part (12) and second housing part (14), whereby the change between the engaged and disengaged state is realized by a movement of the first locking element (30).

20 Claims, 8 Drawing Sheets

(56) References Cited

U.S. PATENT DOCUMENTS

| | | | |
|---|---|---|---|
| 7,072,624 B2* | 7/2006 | Zheng | H04M 1/0252 |
| | | | 455/90.3 |
| 7,272,011 B2* | 9/2007 | Chen | G06F 1/181 |
| | | | 361/726 |
| 8,639,319 B2 | 1/2014 | Hugh | |
| 8,727,170 B2 | 5/2014 | Kim | |
| 8,801,050 B2* | 8/2014 | Chen | H04M 1/0249 |
| | | | 292/37 |
| 9,063,696 B2* | 6/2015 | Huang | G06F 1/1626 |
| 9,072,163 B2* | 6/2015 | Li | G06F 1/1679 |
| 9,429,996 B2* | 8/2016 | Yang | G06F 1/1656 |
| 9,606,575 B2 | 3/2017 | Gerst | |
| 9,661,769 B2 | 5/2017 | Zepf et al. | |
| 9,735,400 B2 | 8/2017 | Watanabe | |
| 9,755,687 B2* | 9/2017 | Chen | H04B 1/3888 |
| 11,412,633 B2* | 8/2022 | Zhong | H05K 7/1488 |
| 2002/0033604 A1 | 3/2002 | Minemayer | |
| 2006/0016675 A1 | 1/2006 | Hong | |
| 2014/0375182 A1* | 12/2014 | Li | G06F 1/1656 |
| | | | 312/223.1 |
| 2015/0277487 A1* | 10/2015 | Gerst | G06F 1/1626 |
| | | | 361/679.01 |
| 2016/0161990 A1* | 6/2016 | Yang | G06F 1/1656 |
| | | | 312/319.1 |
| 2022/0394869 A1* | 12/2022 | Park | E05B 53/003 |

FOREIGN PATENT DOCUMENTS

| | | |
|---|---|---|
| JP | 2015211128 A | 11/2015 |
| WO | 1998053268 A1 | 11/1998 |

* cited by examiner

HOUSING WITH INTERNAL LOCKING ARRANGEMENT

CROSS REFERENCE TO RELATED APPLICATION

The present application is a continuation of co-pending U.S. patent application Ser. No. 17/291,537, filed Oct. 28, 2019, which is the U.S. National Phase application under 35 U.S.C. § 371 of International Application No. PCT/EP2019/079319 filed Oct. 28, 2019, which claims the benefit of European Application No. 18204297.8 filed Nov. 5, 2018. These applications are hereby incorporated by reference herein.

FIELD OF THE INVENTION

The present invention relates to a housing with an internal locking arrangement. The internal locking arrangement finds application in a variety of housings of different size and type. Particularly of interest are housings for electronic and display devices, where the housing parts should be tightly locked and the outer shell smooth without any holes or bulges.

BACKGROUND OF THE INVENTION

Housings exist in a variety of executions to protect the sensitive and fragile electric parts or just any kind of devices that are stored inside. These housings comprise at least two housing parts that are intended to be locked in the closed state of the housing. The locking structure should prevent the different housing parts from falling apart in the engaged state, where the housing is closed. Thus, a reliable locking mechanism is needed. However, a simple opening of the housing should also be possible to easily access the inner parts of the housing, i.e., for reparation or substitution of individual components of the enclosed device.

Many locking structures are using screws, which has the advantage that the device can be easily assembled or disassembled with a proper tool, i.e., a screwdriver. One disadvantage of using screws is that the locking often results in an uneven fixation of the different housing parts. Hence, entry points for liquids and fluids can occur. Furthermore, the assembling and disassembling process is rather time-consuming, because each locking element has to be loosened or tightened by its own. Another profound disadvantage of such a locking structure is that the locking element has to be accessible from the outside of the housing. This can be solved by having locking elements visible on the outer shell of the housing, which is a satisfactory solution for many housings. However, the housing of some particular devices have to fulfil a diversity of requirements. Besides the simple assembling process and the reliable locking mechanism, they shall be watertight and the outer shell of the housing should be smooth. No holes or bulges on the outer shell of the housing are desirable. This is especially of interest for housings that are in contact with fluids and liquids. The smooth shell enables a simple cleaning process, is very hygienic and does not provide possible entry points for liquids.

A number of housings contain an internal locking arrangement based on a snap-fit mechanism with a male and female part, where these interlocking components are pushed together. In comparison to other assembly techniques they have particularly the advantage of speed. However, releasing the interlocking components with a tool from the outside is not that straightforward and can easily lead to damages of the housing.

US 2015/0277487 A1 discloses a housing with an internal locking mechanism where one actuation allows to engage or disengage the first and second engaging portion. However, there remains a need to interlock housing parts by a flexible, space-saving and mechanically simple procedure and in a reliable way.

U.S. Pat. No. 9,072,163 B2 discloses a housing assembly for a portable electronic device, which includes a first body, a second body, a first engaging member, a first resilient member and a first housing.

CN 104 184 849 A discloses a housing with one first housing part and one second housing part, which are reliably locked by an internal locking arrangement. The locking arrangement is suitable for various types and sizes of housings, particularly for the housings of electronic and display devices.

U.S. Pat. No. 9,063,696 B2 discloses a fixing mechanism, which includes a first engaging portion, a base, a first latch and a resilient component.

US 2006/016675 A1 discloses a supporting device for the control buttons of electronic instruments and electronic instruments adapting the same.

SUMMARY OF THE INVENTION

It is an object of the present invention to provide a housing comprising at least two housing parts that can be simply assembled and disassembled and that provides a smooth shell of the housing without any holes or bulges. The internal locking mechanism of the housing should be space-saving and concealed.

In a first aspect of the present invention a housing is presented comprising:
a first housing part;
a second housing part; and
an internal locking arrangement for engaging said first housing part and second housing part,
wherein said internal locking arrangement comprises:
a first locking element having a first engaging portion arranged moveably along an axis on an inner wall of the first housing part;
a second locking element having a second engaging portion arranged on the inner wall of the first housing part; and
a third locking element having a third engaging portion arranged on an inner wall of the second housing part;
wherein said first engaging portion is configured to be moveable between an engaged state, in which the third engaging portion is locked-in between the first engaging portion and second engaging portion, and a disengaged state, in which the third engaging portion is not locked-in.

In a further aspect of the present invention a monitor device is presented, particularly of interest for medical applications, comprising a display for presenting information and a housing as disclosed herein.

Preferred embodiments of the invention are defined in the dependent claims.

The present invention is based on the idea to have a housing, which may be used in the medical field for display devices, with a reliable, space-saving internal locking arrangement for engaging a first and a second housing part. The engaging portions can be brought into an engaged or disengaged state by just one simple actuation without accessing the single engaging portions. In the engaged state both housing parts are interlocked with each other, while in the disengaged state both housing parts are in a disjointed state. The interlocking of the housing parts is solved by a unidirectional movement, forward and backward, of the first engaging portion and the further existence of a third engaging portion. The third engaging portion is locked-in by the first and a second engaging portion in the engaged state. Locked-in shall be understood such that the third engaging portion is located and preferably clamped or trapped between the first and second engaging portion and in contact with the first and second engaging portion. The opening force of the housing is perpendicular to the direction of movement of the first engaging portion, i.e. the mechanism is locked reliably by itself.

The first, second and third engaging portions are arranged on a first, second and third locking element, respectively. The first and second locking element in turn are arranged on the inner wall of the first housing part and the third locking element is arranged on the inner wall of the second housing part. Thus, an opening of the housing for accessing the engaging portions is not required and the outside of the housing is smooth without any holes or bulges. It is noted that no part of the locking structure is visible from the outside. This is especially beneficial if the housing undergoes regular cleaning processes, which is the case, e.g., in the medical field.

According to an embodiment, the housing comprises a plurality of internal locking arrangements. Only one internal locking arrangement may not be sufficient to have a watertight housing in the gap between the first and second housing part. As the internal locking mechanism is variable in the length of the first locking element as well as the number of engaging portions, the housing can be made suitable for different types and sizes of housings. The locking arrangement is variable and can be used all around in the housing. Furthermore, the space-saving arrangement can be realized in a very compact way, wherein not much space is needed for the engagement and disengagement.

According to another embodiment of the housing, only the first engaging portion is moveable along an axis. The other two engaging portions, namely the second engaging portion and the third engaging portion, are fixedly arranged on the inner wall of the corresponding housing parts. The second engaging portion is fixedly arranged on the inner wall of the first housing part and the third engaging portion is fixedly arranged on the second housing part. Thus, only the first engaging portion needs to be moved along an axis for switching between the engaged and disengaged state, which is a mechanically simple procedure.

According to another embodiment of the housing, the second engaging portion is configured as a female receiving portion. Thus, the second engaging portion has any kind of opening with a certain shape that corresponds to the shape of the first engaging portion, which is configured as a male penetrating portion. The first engaging portion penetrates into the second engaging portion in the engaged state by a unidirectional movement.

Preferably, the shape of the first engaging portion corresponds with the shape of the second engaging portion and is further concretized by having the shape of a bar, tip, cylinder, spike or pin. The second engaging portion in turn is configured as the corresponding female receiving portion with a preferable shape of a lug, recess, groove or bore.

According to another embodiment of the housing, the movement of the first engaging portion along one axis can be parallel to the longitudinal axis of the first locking element or inclined with respect to the longitudinal axis of the first locking element. An angle up to 45° may be practicable, wherein the second engaging portion is still forming the female receiving portion. Hence, the second engaging portion is equally inclined with respect to the longitudinal axis of the first locking element.

According to another embodiment of the housing, the first locking element has a first mounting element, the second locking element has a second mounting element and the third engaging portion is arranged at a position on the inner wall of the second housing part that allows to lock in the third engaging portion by covering an upper surface of said third engaging portion with the first engaging portion.

According to this embodiment of the housing, the first engaging portion is not configured to be directly moveable since it is fixedly arranged on the first mounting element or formed integrally with the first mounting element. The mounting element in turn is fixedly arranged on the first locking element or formed integrally with the first locking element. Thus, a movement of the first locking element is configured to switch between the engaged and disengaged state.

The first engaging portion is preferably arranged substantially perpendicular to the front surface of the first mounting element. Hereby, the front surface of the first mounting element, an undersurface of the first engaging portion and the front surface of the second mounting element are configured to enclose a three-dimensional enclosed space, in which the third engaging portion is locked-in in the engaged state. Locked-in shall be understood such that the surface of the third engaging portion is in contact with the front surface of the first mounting element, an undersurface of the first engaging portion and the front surface of the second mounting element. Thus, the enclosed space is completely filled by the third engaging portion.

Preferably, the third engaging portion filling this enclosed space has the shape of a hook, bar, tip, pin or spike.

Further, an inner surface of the second engaging portion as well as an upper surface of the third engaging portion limit the movement of the first engaging portion in the engaged state perpendicular to the movement direction of the first engaging portion. Said inner surface of the second engaging portion as well as the upper surface of third engaging portion are in contact with the first engaging portion in the engaged state. Thus, the locking arrangement is reliably locked by itself.

According to another embodiment, the housing further comprises an internal opening tool being configured to move the first engaging portion manually into the engaged or disengaged state. The internal opening tool may be concealed in the housing, but may also be arranged such that it is accessible from a particular (already existing or separately provided) opening of the housing, such as a cooling slit.

Preferably, this internal opening tool comprises a first attaching element and a second attaching element, wherein the space between the first attaching element and second attaching element is configured to trap the first mounting element in order to switch between the engaged and disengaged state by a manual movement of the internal opening tool.

BRIEF DESCRIPTION OF THE DRAWINGS

These and other aspects of the invention will be apparent from and elucidated with reference to the embodiment(s) described hereinafter. In the following drawings

DETAILED DESCRIPTION OF EMBODIMENTS

Figure 1:
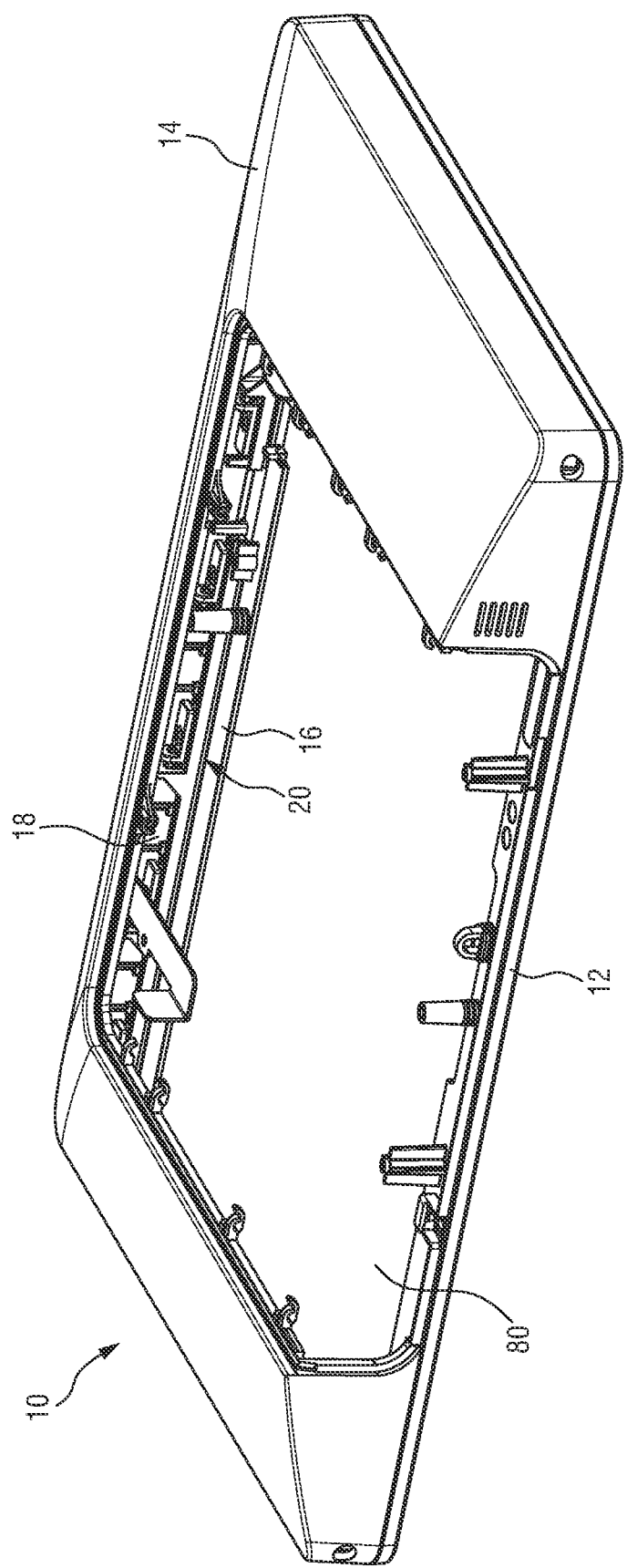
FIG. 1 shows a perspective view of a preferred embodiment of a housing according of the present invention in a closed state.
Figure 2:
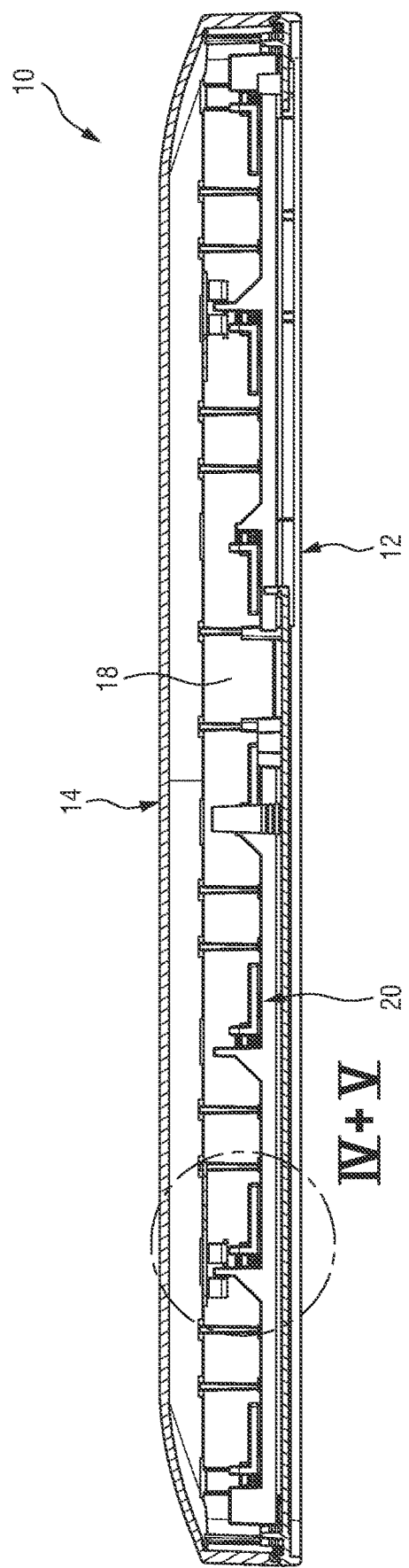
FIG. 2 shows a cross sectional view of the housing shown in FIG. 1.

FIG. 1 shows a perspective view of an embodiment of a housing 10 according to the present invention in a closed state. FIG. 2 shows a corresponding cross-sectional view of said embodiment of the housing 10. The housing 10 comprises a first housing part 12 and a second housing part 14 and is shown in a closed state, in which the housing parts 12, 14 are joined together. The housing 10 may be made of plastic and/or metal and configured for housing a display or monitor, but the housing may be use for housing other components as well. In this embodiment the housing 10 comprises an opening 80, e.g., to accommodate a display of a patient monitor to display patient-relevant data.

The housing parts 12, 14 are joined together by one or more internal locking arrangements 20. Generally, one single internal locking arrangement may be sufficient, but multiple internal locking are preferably provided around the circumference of the housing to improve the stability and security of the closing of the housing. The preferred position of the locking arrangement 20 is close to the boundary of the first housing part 12 and the second housing part 14 and close to the inner wall 16 of the first housing part 12 and the inner wall 18 of the second housing part 14 in order to provide an optimized distribution of force. Other arrangement and positions are, however, possible as well.

The internal locking arrangement 20 is partly arranged on the inner wall 16 of the first housing part 12 and partly on the inner wall 18 of the second housing part 14. In FIGS. 1 and 2 the internal locking arrangement 20 is in an engaged state providing a jointed state of the first housing part 12 and the second housing part 14. In this state an accidental opening of housing 10 is impossible or at least unlikely. Only switching the internal locking arrangement 20 into a disengaged state enables to disjoint the first housing part 12 and the second housing part 14 by subsequently moving the second housing part 14 away from the first housing part 12. Preferably, only one actuation is needed to switch between the engaged and disengaged state because all locking arrangements are interlocked.

Figure 3:
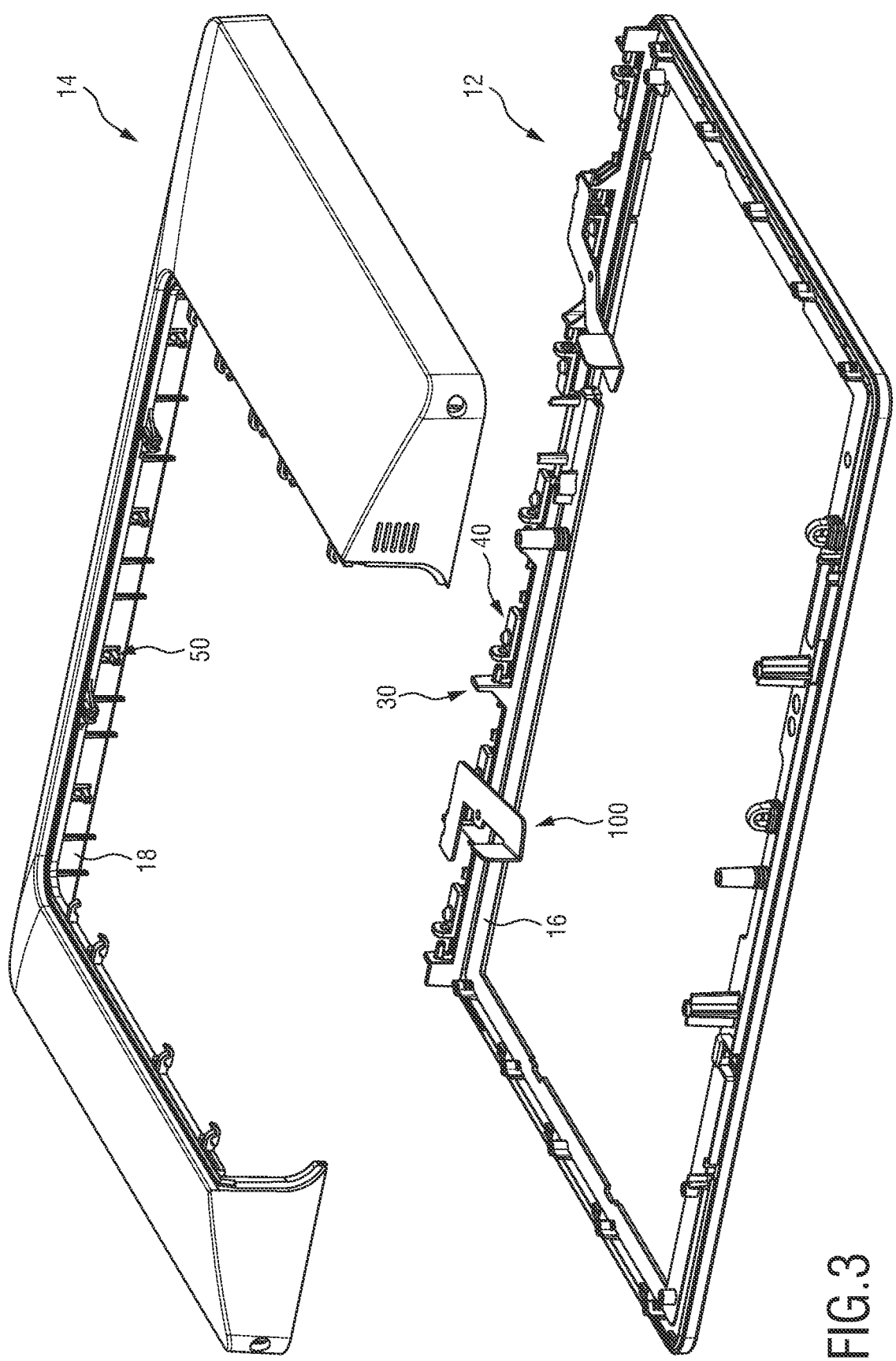
FIG. 3 shows a perspective view of the housing shown in FIG. 1 in an open state.

The first housing part 12 and the second housing part 14 are shown in a disjointed state in FIG. 3, in which the housing 10 is in an open state. As shown there, the internal locking arrangement 20 comprises a first locking element 30 and a second locking element 40, which are both arranged on the first housing part 12 (preferably on an inner wall 16), and a third locking element 50, which is arranged on the second housing part 14 (preferably on an inner wall 18). An internal opening tool 100 is provided to enable opening of the housing. Details of the constructing and function of the locking elements 30, 40, 50 and of the internal opening tool 100 will be explained below with reference to FIGS. 4-8.

Figure 4:
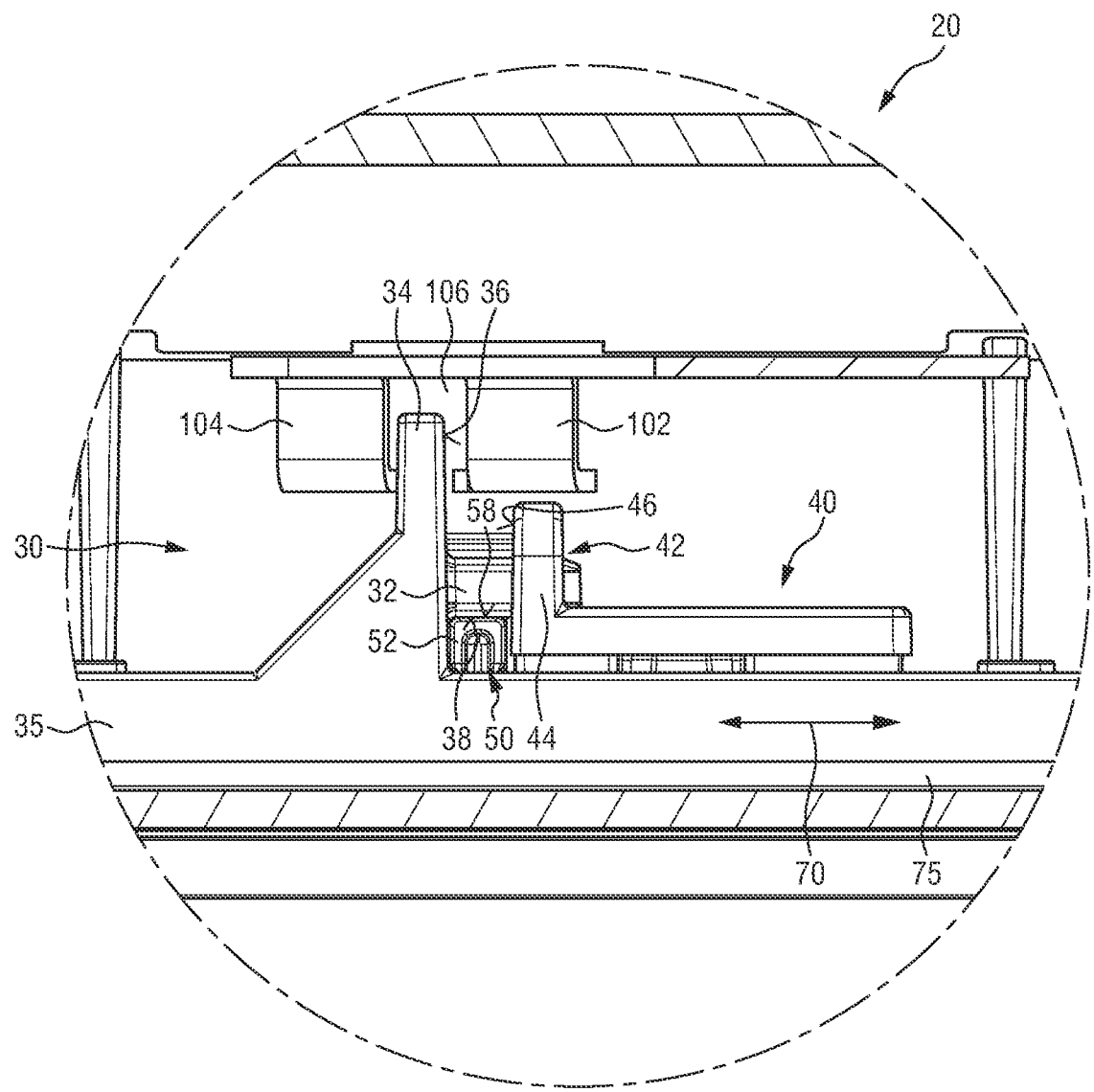
FIG. 4 shows an enlarged view of an embodiment of an internal locking arrangement in an engaged state.
Figure 5:
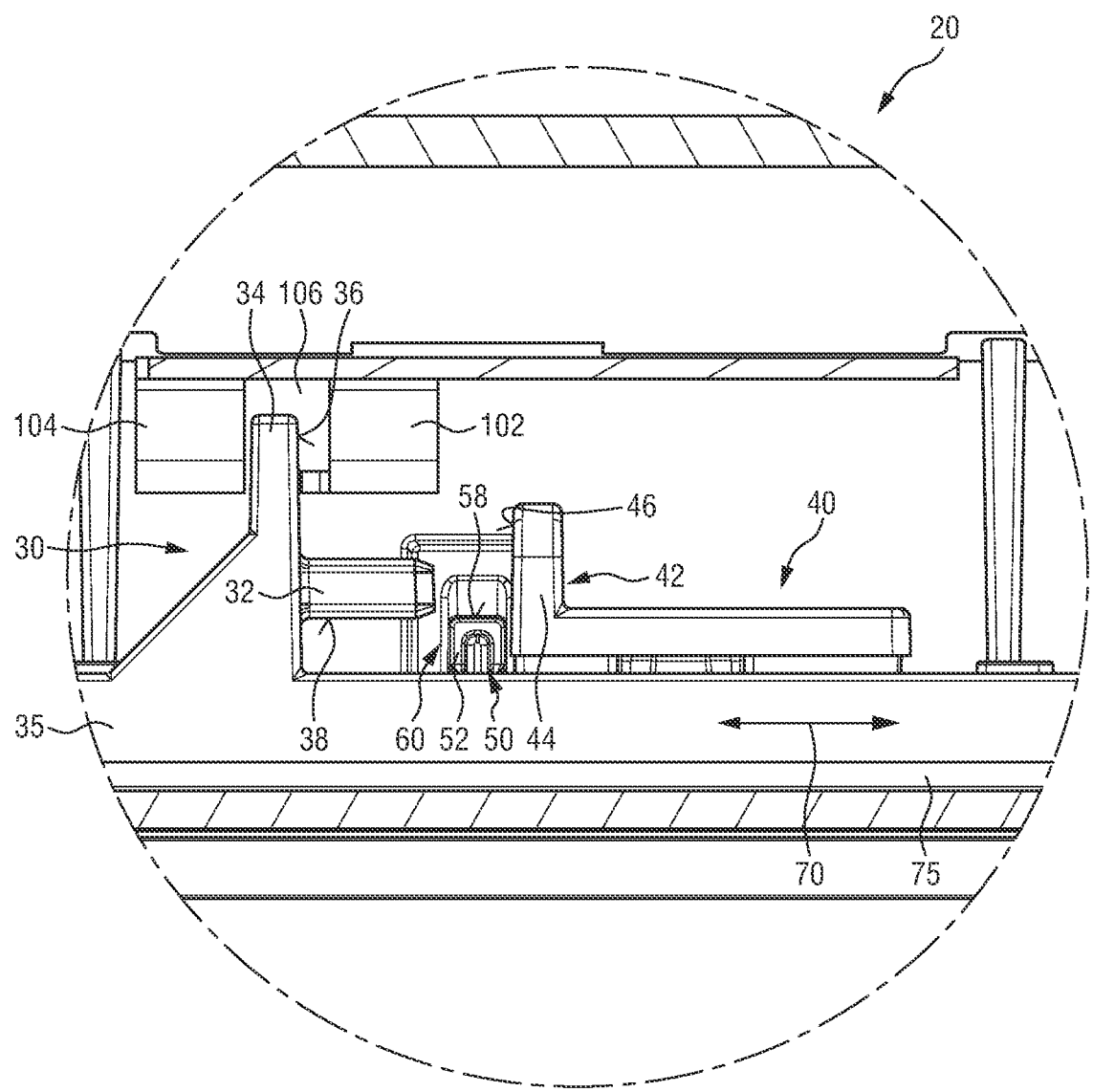
FIG. 5 shows an enlarged view of the internal locking arrangement shown FIG. 4 in a disengaged state.
Figure 6:
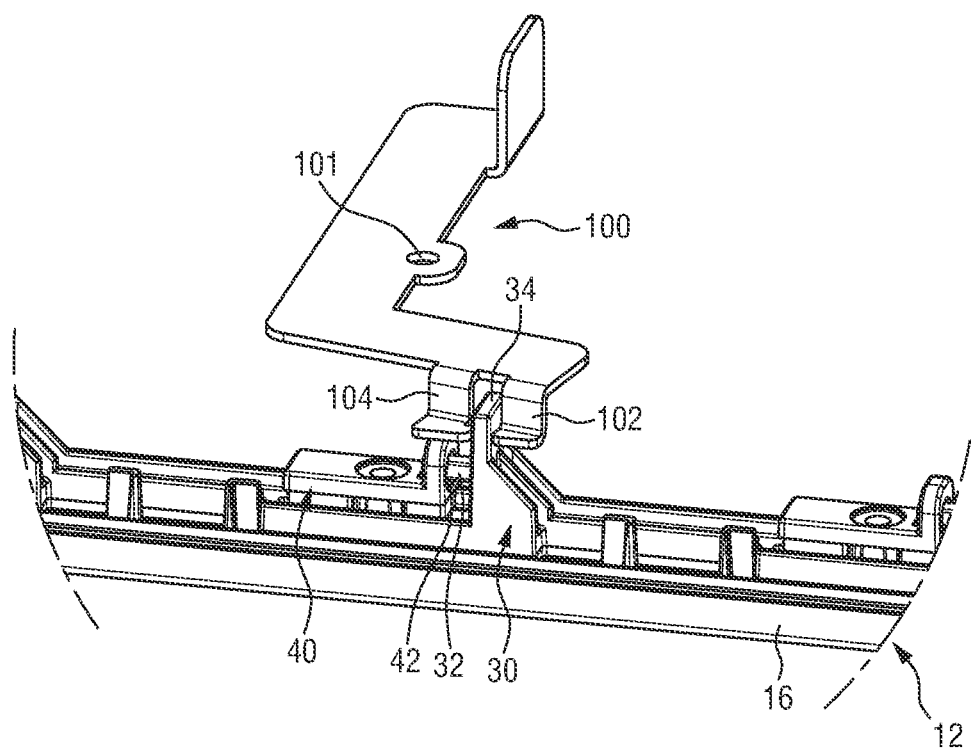
FIG. 6 shows a perspective view of the internal locking arrangement shown in FIG. 4 and an internal opening tool.
Figure 7:
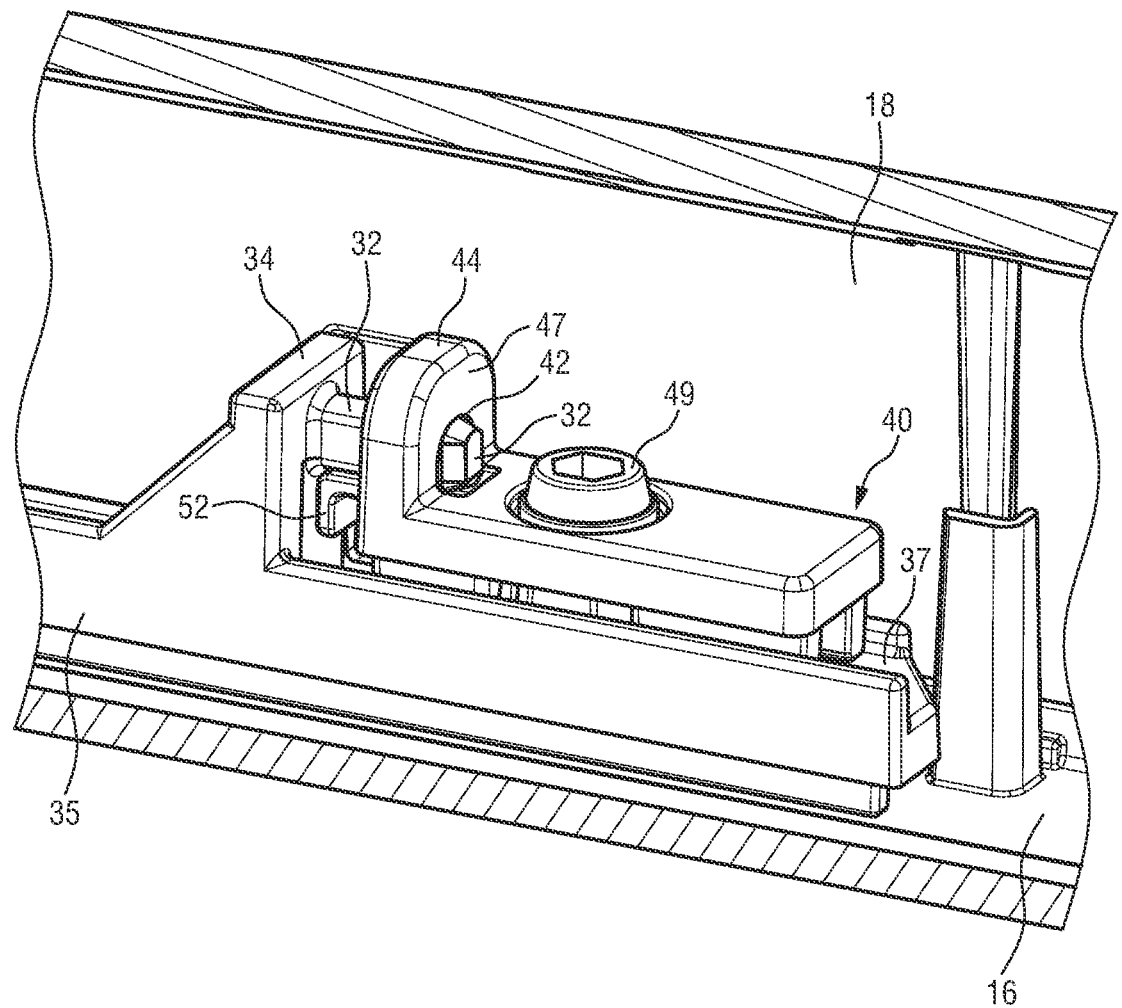
FIG. 7 shows another perspective view of the internal locking arrangement shown in FIG. 4 in an engaged state.
Figure 8:
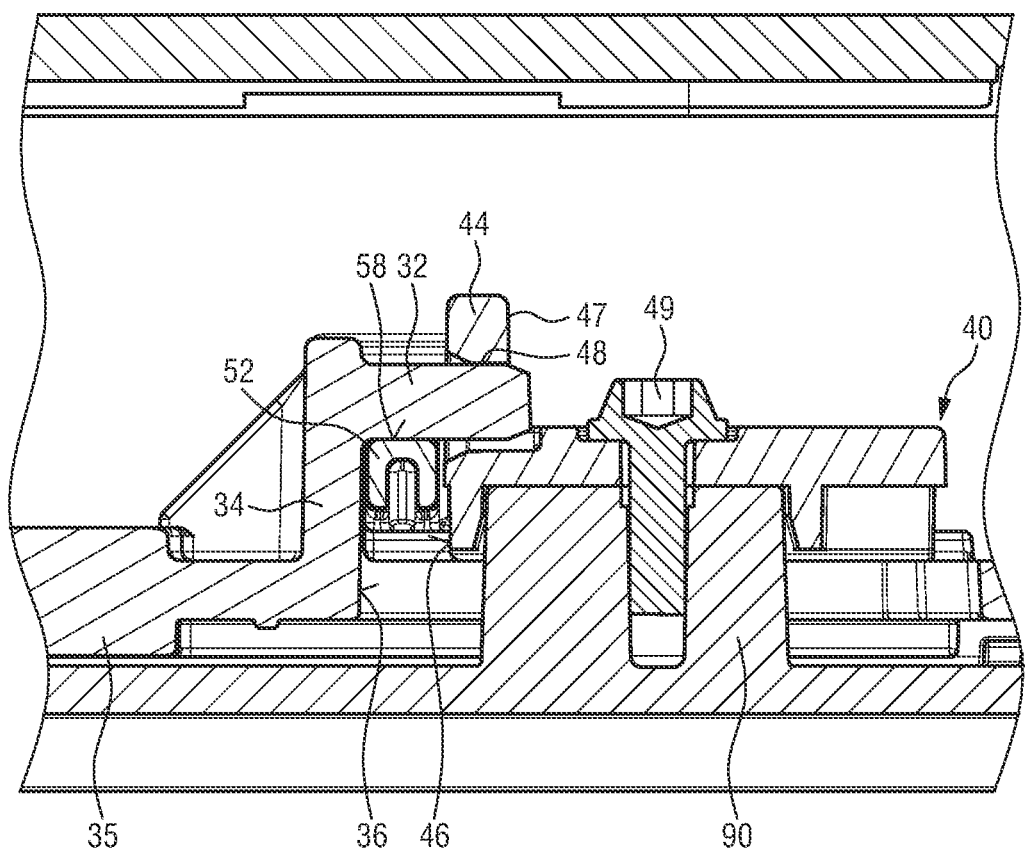
FIG. 8 shows a cross-sectional view of the internal locking arrangement shown in FIG. 4 in an engaged state.

FIG. 4 shows an enlarged view of an embodiment of an internal locking arrangement 20 in an engaged state, in which the first housing part 12 and the second housing part 14 are in a jointed state. FIG. 5 shows an enlarged view of said internal locking arrangement 20 in a disengaged state, in which the first housing part 12 and the second housing part 14 are in a disjointed state. FIG. 6 shows a perspective view of said internal locking arrangement 20 and an internal opening tool 100. Another perspective view of said internal locking arrangement 20 without the internal opening tool 100 and with both housing parts is shown in FIG. 7. FIG. 8 shows a cross-sectional view of the internal locking arrangement 20 in the engaged state.

The first locking element 30 is arranged on the first housing part 12. In this embodiment the first locking element 30 comprises a first engaging portion 32, which is fixedly arranged on a first mounting element 34. In this embodiment, the first engaging portion 32 is formed integrally with the first mounting element 34. The first mounting element 34 is, in this embodiment, formed integrally on a sliding element 35, preferably as erected portion. The sliding element 35 may be configured such that it connects multiple first locking elements 30, i.e. the sliding element 35 is common to multiple first locking elements 30 arranged along the same edge portion of the first housing part 12.

The first locking element 30 arranged moveably along an axis 70 on the inner wall 16 of the first housing part 12 and configured to be moveable forward and backward along this axis 70. Preferably, the sliding element 35 is configured like slide or carriage that is configured to slide along a track or guide rail 75 that is fixed to the inner wall 16 of the first housing part 12 or to slide directly along the inner wall 16 of the first housing part 12. The axis 70 is preferably arranged parallel to the longitudinal axis of the first locking element 30.

The second locking element 40 is fixedly arranged on the inner wall 16 of the first housing part 12 and works as an attachment for the first locking element 30 and as the corresponding counterpart for the first locking element 30 in the locking process. The second locking element 40 comprises a second mounting element 44, which in turn comprises a second engaging portion 42, which is formed integrally with the second mounting element 44 in the specific embodiment. The second mounting element 44 is oriented perpendicular to the longitudinal axis of the second locking element 40 and contains an opening, which represents the second engaging portion 42.

The third locking element 50 is arranged fixedly on the inner wall 18 of the second housing part 14. It comprises a third engaging portion 52 that is preferably oriented perpendicular to the longitudinal axis (which is preferably parallel to the movement axis 70) of the first engaging portion 32 in the jointed state of housing 10. The inner wall 18 of the second housing part 14 is preferably oriented perpendicular to the inner wall 16 of the first housing part 12.

As particularly shown in FIG. 7, the sliding element 35 basically works like a sliding gate and has a longitudinal, e.g. U-shaped, cavity 37, in which the second locking element 40 is placed. The second locking element 40 is fixedly attached to the inner wall 16 of the first housing part by a screw 49. Thus, the second locking element 40 holds the sliding element 35 and hence the complete first locking element 30 towards the inner wall 16 of the first housing part 12, without limiting the movement of the first locking element 30 along said axis 70. In other words, the first locking element 30 is indirectly clamped towards the inner wall 16 of the first housing part 12 by the second locking element 40.

The movement of the first locking element 30 allows to switch between the engaged and disengaged state of the locking arrangement 20. Hence, a mechanically simple procedure enables to reliably joint the first housing part 12 and second housing part 14 together. Hereby, an internal opening tool 100, which may be accessible from the outside of the housing, i.e., by any kind of slit or opening in the first housing part 12 or second housing part 14, is configured to move the first locking element 30.

Said internal opening tool 100 is particularly shown in FIG. 6. In this embodiment it may be concealed in the housing enabling a smooth outer shell of housing 10. This is of particular interest for housings used in the field of medical applications, where regular cleaning processes are important. The internal opening tool 100 may be a gearing mechanism or a lever. A fixed gearing results from the fixed arrangement of the internal opening tool 100 by, e.g., a screw through opening 101 in the internal opening tool 100 on one of the housing parts, whereas a floating bearing results from the first attaching element 102 and second attaching element 104, which are configured to move the first locking element 30 by locking in the first mounting element 34. By varying the position of the fixed bearing, the length of the lever or the position of the floating bearing on the first locking element 30, free relocation of handling position is possible and the force can be adjusted. Likewise, by varying the length of the lever, the position of the floating bearing between the first locking element 30 and the internal opening tool 100, the position of the fixed bearing and the geometry of the internal opening tool 100, enables to select the position of the handling and thus adapt it to the present internal design of the housing.

In this particular embodiment, the internal opening tool 100 comprises a first attaching element 102 and a second attaching element 104, which are configured like fingers. The space 106 between the first attaching element 102 and the second attaching element 104 is configured to lock in the first mounting element 34. Thus, the first locking element 30 can be moved between the engaged state (shown in FIG. 4) and disengaged state (shown in FIG. 5).

As shown in FIGS. 4 to 8, the first engaging portion 32 has the shape of bar, tip, cylinder, spike or pin and is configured as a male penetrating portion for the second engaging portion 42, which is forming the corresponding female receiving portion. Thus, the second engaging portion 42 has the shape of a lug, recess, groove or bore and encloses the first engaging portion 32 in the engaged state (see FIGS. 4 and 8). The tip of the first engaging portion 32 crosses the second engaging portion 42 completely in the engaging process and becomes apparent at the backside 47 of the second mounting element 44. From the engaged to the disengaged state, the first locking element 30 must be moved a few millimeters, but the mechanism as a whole realizes a locked housing 10 across a distance of several centimeters, from where a next combination of first engaging portions 32, second engaging portions 42 and third engaging portions 52 may be applied. By having a plurality of internal opening tools 100, which might be coupled to each other or might be separate components, the slight movement of the first locking element 30 can lead to a closing mechanism of various sides of the housing 10. Thus, the first housing part 12 and second housing part 14 can be assembled simply and fast by one actuation along the single axis 70.

It should be noted that the first engaging portion 32 and the second engaging portion 42 are configured as a male penetrating portion and a female receiving portion, respectively, according to the embodiments shown in FIGS. 4 to 8. The present invention is, however, not restricted to such exemplary embodiments. In general, the shape of the first engaging portion 32 and the shape of the second engaging portion 42 may also be configured differently, in particular such that these portions do not form male penetrating and female receiving portions. The first engaging portion 32 may, e.g., be a pin, while the second engaging portion 42 may, e.g., be another pin formed integrally with the second mounting element 44, instead of being a lug or a bore as shown in FIGS. 4 to 8. According to said embodiment, the first engaging portion 32 may contact the second engaging portion 42 (not shown in FIGS. 4 to 8) instead of penetrating a lug or a bore in the engaged state. This embodiment is also configured to lock-in the third engaging portion 52 between the first engaging portion 32 and the second engaging portion 42 and thus also provides a concealed and space-saving locking mechanism.

FIG. 4 shows that the third engaging portion 52 is locked-in by covering an upper surface 58 of said third engaging portion 52 with the first engaging portion 32. In the specific embodiment, the third engaging portion 52 is arranged between a front surface 36 of the first mounting element 34 facing towards the second mounting element 44 and the front surface 46 of the second mounting element 44 facing towards the front surface 36 of the first mounting element 34. Thus, the position of the third engaging portion 52 on the inner wall 18 of the second housing part 14 is predetermined so that the third engaging portion 52 becomes locked-in in the engaged state.

Furthermore, in this embodiment the first engaging portion 32 is arranged substantially perpendicular to the front surface 36 of the first mounting element. Hence, the third engaging portion 52 is not only locked-in between a front surface 36 of the first mounting element 34 and the front surface 46 of the second mounting element 44, but also below the undersurface 38 of the first engaging portion 32. In that case, the movement of the first engaging portion 32 is reliably locked in the direction perpendicular to the movement direction of the first locking element 30 and thus the internal locking arrangement 20 exhibits a certain self-locking mechanism. Specifically, an inner surface 48 of the second engaging portion 42 and an upper surface 58 of the third engaging portion 52 limit the movement of the first engaging portion 32 in the engaged state as shown in FIG. 8. FIG. 8 further reveals that screw 49 attaches the second mounting element 40 to a connecting element 90, which is arranged on the first housing part 12. Thus, the position of the second locking element 40 is predetermined and a movement of the second locking element 40 is impossible under the condition that screw 49 is firmly tightened.

The locked state is released by moving the first locking element 30 backward along the movement axis 70. FIG. 5 shows that the third engaging portion 52 is placed in an enclosed space 60, which is enclosed by the first mounting element 34, second mounting element 44 and the third engaging portion 52 in the engaged state. The first housing part 12 and the second housing part 14 can be easily disjointed in the disengaged state of the locking arrangement 20.

It is to be noted that the first engaging portion 32 and the second engaging portion 42 may take other forms different to the embodiment described here. Preferably, the form of the second engaging portion 42 enables the second engaging portion 42 to form a female receiving portion for the first engaging portion 32, which is forming the male penetrating portion. Moreover, the third engaging portion 52 may be formed in a different way. Preferably, this third engaging portion 52 is formed to fit in the enclosed space 60.

With the present invention, a mechanism for opening and closing a housing can be realized inside of the housing, concealed from the outside, in minimal installation space, and independently from the handling position for operating. In principle the locking mechanism can be applied with all types of housings. Examples of this include housings for electronic devices with a metal or plastic housing. As this mechanism is variable in dimension, e.g. in length of the sliding element and the amount of engaging portions, it can be made suitable for different types and sizes of housings.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A housing comprising:
a first housing part;
a second housing part; and
an internal locking arrangement for engaging said first housing part and second housing part,
wherein said internal locking arrangement comprises:
a first locking element having a first engaging portion (32) arranged moveably along an axis on an inner wall of the first housing part;
a second locking element having a second engaging portion (42) arranged on the inner wall of the first housing part; and
a third locking element having a third engaging portion (52) arranged on an inner wall of the second housing part;
wherein said first engaging portion is configured to be moveable between an engaged state, in which the third engaging portion is locked-in between the first engaging portion and second engaging portion in an enclosed space, which is formed by the first engaging portion and the second engaging portion, and a disengaged state, in which the third engaging portion is not locked-in,
wherein the first engaging portion, in the engaged state, covers a surface of the third engaging portion and axially extends into an opening in the second engaging portion, and
wherein the first engaging portion, in the disengaged state, exposes the surface of the third engaging portion and is axially spaced from the opening in the second engaging portion.

2. The housing according to claim 1, wherein the housing comprises a plurality of internal locking arrangements.

3. The housing according to claim 1, wherein the second engaging portion is fixedly arranged on the inner wall of the first housing part and the third engaging portion is fixedly arranged on the inner wall of the second housing part.

4. The housing according to claim 1, wherein the first engaging portion has the shape of a bar, tip, cylinder, spike or pin and the second engaging portion the shape of a lug, recess, groove or bore.

5. The housing according to claim 1, wherein the axis, along which the first engaging portion is moveable, is parallel to the longitudinal axis of the first locking element or inclined with respect to the longitudinal axis of the first locking element at an angle equal to or less than 45°.

6. The housing according to claim 1, wherein the first locking element comprises a first mounting element, the second locking element comprises a second mounting element and the third engaging portion is arranged at a position on the inner wall of the second housing part that allows to lock in the third engaging portion by covering an upper surface of said third engaging portion with the first engaging portion.

7. The housing according to claim 6, wherein the first engaging portion is fixedly arranged on the first mounting element or formed integrally with the first mounting element.

8. The housing according to claim 7, wherein the first engaging portion is arranged substantially perpendicular to the front surface of the first mounting element.

9. The housing according to claim 6, wherein the front surface of the first mounting element, an undersurface of the first engaging portion and the front surface of the second mounting element are configured to enclose an enclosed space, in which the third engaging portion is locked-in in the engaged state.

10. The housing according to claim 9, wherein the third engaging portion has the shape of a hook, bar, tip, pin or spike, and fits into the enclosed space.

11. The housing according to claim 10, wherein an inner surface of the second engaging portion as well as the upper surface of the third engaging portion limit the movement of the first engaging portion in the engaged state.

12. The housing according to claim 1, further comprising an internal moveable opening tool being accessible from an opening of at least one of the first housing part and of the second housing part, wherein the internal tool comprises a first attaching element and a second attaching element to lock in a first mounting element of the first locking element to move the first engaging portion into the engaged state and the disengaged state by a movement of the moveable opening tool.

13. The housing according to claim 12, wherein the internal opening tool comprises a first attaching element and a second attaching element, wherein the space between the first attaching element and the second attaching element is configured to lock in the first mounting element allowing to switch the first engaging portion between the engaged state and the disengaged state by movement of the internal opening tool.

14. A patient monitor device, comprising a display and the housing of claim 1 for housing the display.

15. A housing comprising:
a first housing part;
a second housing part; and
an internal locking arrangement for engaging said first housing part and second housing part, wherein said internal locking arrangement comprises:
a first locking element having a first engaging portion arranged moveably along an axis on an inner wall of the first housing part;
a second locking element having a second engaging portion arranged on the inner wall of the first housing part; and
a third locking element having a third engaging portion arranged on an inner wall of the second housing part;
wherein said first engaging portion is configured to be moveable between an engaged state, in which the third engaging portion is locked-in between the first engaging portion and second engaging portion in an enclosed space, which is formed by the first engaging portion and the second engaging portion, and a disengaged state, in which the third engaging portion is not locked-in, and
wherein the first locking element comprises a first mounting element, the second locking element comprises a second mounting element and the third engaging portion is arranged at a position on the inner wall of the second housing part that allows to lock in the third engaging portion by covering an upper surface of said third engaging portion with the first engaging portion.

16. The housing according to claim 15, wherein the first engaging portion is fixedly arranged on the first mounting element or formed integrally with the first mounting element.

17. The housing according to claim 16, wherein the first engaging portion is arranged substantially perpendicular to the front surface of the first mounting element.

18. The housing according to claim 15, wherein the front surface of the first mounting element, an undersurface of the first engaging portion and the front surface of the second mounting element are configured to enclose an enclosed space, in which the third engaging portion is locked-in in the engaged state.

19. A housing comprising:
a first housing part;
a second housing part; and
an internal locking arrangement for engaging said first housing part and second housing part,
wherein said internal locking arrangement comprises:
a first locking element having a first engaging portion arranged moveably along an axis on an inner wall of the first housing part;
a second locking element having a second engaging portion arranged on the inner wall of the first housing part; and
a third locking element having a third engaging portion arranged on an inner wall of the second housing part;
wherein said first engaging portion is configured to be moveable between an engaged state, in which the third engaging portion is locked-in between the first engaging portion and second engaging portion in an enclosed space, which is formed by the first engaging portion and the second engaging portion, and a disengaged state, in which the third engaging portion is not locked-in, and
wherein the housing further comprises an internal moveable opening tool being accessible from an opening of at least one of the first housing part and of the second housing part, wherein the internal tool comprises a first attaching element and a second attaching element to lock in a first mounting element of the first locking element to move the first engaging portion into the engaged state and the disengaged state by a movement of the moveable opening tool.

20. The housing according to claim 19, wherein the internal opening tool comprises a first attaching element and a second attaching element, wherein the space between the first attaching element and the second attaching element is configured to lock in the first mounting element allowing to switch the first engaging portion between the engaged state and the disengaged state by movement of the internal opening tool.

* * * * *